(12) United States Patent
Chanda et al.

(10) Patent No.: US 11,217,738 B2
(45) Date of Patent: Jan. 4, 2022

(54) PLASMON-ASSISTED PHOTOTHERMOELECTRIC EFFECT BASED DETECTION OF INFRARED RADIATION ON ASYMMETRICALLY PATTERNED GRAPHENE

(71) Applicant: University of Central Florida Research Foundation, Inc., Orlando, FL (US)

(72) Inventors: Debashis Chanda, Oviedo, FL (US); Michael Leuenberger, Orlando, FL (US); Alireza Safaei, Orlando, FL (US); Sayan Chandra, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 192 days.

(21) Appl. No.: 16/555,449

(22) Filed: Aug. 29, 2019

(65) Prior Publication Data
US 2021/0280760 A1    Sep. 9, 2021

Related U.S. Application Data

(60) Provisional application No. 62/725,297, filed on Aug. 31, 2018.

(51) Int. Cl.
*H01L 35/22* (2006.01)
*G01J 5/18* (2006.01)
*G01J 5/26* (2006.01)

(52) U.S. Cl.
CPC .............. *H01L 35/22* (2013.01); *G01J 5/18* (2013.01); *G01J 5/26* (2013.01)

(58) Field of Classification Search
CPC .............. G01J 5/18; G01J 5/26; H01L 35/22
See application file for complete search history.

(56) References Cited

U.S. PATENT DOCUMENTS

2013/0193404 A1\*    8/2013    Koppens ............ H01L 31/0547
                                                              257/9

\* cited by examiner

*Primary Examiner* — Mark R Gaworecki
(74) *Attorney, Agent, or Firm* — Preti Flaherty Beliveau & Pachios LLP

(57) ABSTRACT

Various methods and devices for ultrasensitive infrared photodetection, infrared imaging, and other optoelectronic applications using the plasmon assisted thermoelectric effect in graphene are described. Infrared detection by the photo-thermoelectric uses the generation of a temperature gradient ($\Delta T$) for the efficient collection of the generated hot-carriers. An asymmetric plasmon-induced hot-carrier Seebeck photodetection scheme at room temperature exhibits a remarkable responsivity along with an ultrafast response in the technologically relevant 8-12 μm band. This is achieved by engineering the asymmetric electronic environment of the generated hot carriers on chemical vapor deposition (CVD) grown large area nanopatterned monolayer graphene, which leads to a record $\Delta T$ across the device terminals thereby enhancing the photo-thermoelectric voltage beyond the theoretical limit for graphene. The results provide a strategy for uncooled, tunable, multispectral infrared detection.

19 Claims, 19 Drawing Sheets

PLASMON-ASSISTED PHOTOTHERMOELECTRIC EFFECT BASED DETECTION OF INFRARED RADIATION ON ASYMMETRICALLY PATTERNED GRAPHENE

STATEMENT REGARDING FEDERALLY SPONSORED RESEARCH OR DEVELOPMENT

This invention was made with government support under HR0011-16-1-0003 awarded by the U.S. Department of Defense, Defense Advanced Research Projects Agency. The government has certain rights in the invention.

BACKGROUND OF THE INVENTION

Various embodiments relate generally to infrared radiation detection systems, methods, devices and computer programs and, more specifically, relate to plasmon assisted photothermoelectric detection of infrared radiation.

This section is intended to provide a background or context. The description may include concepts that may be pursued, but have not necessarily been previously conceived or pursued. Unless indicated otherwise, what is described in this section is not deemed prior art to the description and claims and is not admitted to be prior art by inclusion in this section.

In conventional systems, there are two major classes of infrared (IR) detectors: cooled (quantum) and uncooled (thermal).

In cooled detectors, in order to detect low energy mid-IR photons narrow bandgap semiconductors are needed. Semiconductor detectors function based on photovoltaic or photoconductive effects and depends on semiconductor bandgap. Among quantum detectors HgCdTe (MCT) is widely used due to high sensitivity over both atmospheric transparent windows (3-5 μm and 8-12 μm). However, these detectors need cryogenic cooling in order to decrease the thermal fluctuations and detect low energy mid-IR photons which make them expensive and unusable in some cases where cryogenic cooling is not possible.

For uncooled detectors, microbolometers type thermal detectors are attractive as they can function at ambient temperature albeit with less sensitivity and high response time~20-25 ms due to higher background noise and bulk thermal response, respectively. Conventional vanadium oxide ($VO_x$) based microbolometers suffer from relatively low sensitivity, slow response, tedious multi-step complex lithographic processes, and lack of frequency selective and multi-spectral detection/imaging abilities.

Infrared (IR) detection and imaging over atmospheric transparent 3-5 μm and 8-12 μm bands are increasingly becoming important for space explorations, spectroscopy, meteorology, chemical/biological identification, short range communication, flame detection, radiation thermometer, target tracking, night vision, remote sensing, leak detection etc. However, there are two major limitations in mid-IR detection and imaging. First, due to the low photon energy of mid-IR radiation cryogenic cooling is required for high sensitive detection based on low bandgap materials like mercury-cadmium-telluride (HgCdTe). Various kinds of microbolometers primarily based on vanadium oxide ($VO_x$) offer uncooled detection of IR radiations. However, microbolometers suffer from low sensitivity, slow response and tedious multi-step complex lithographic processes. The second drawback is the absence of frequency tunability for multi-spectral infrared detection/imaging. At present cooled and uncooled mid-IR detectors are being "bucket" detectors generating integrated signals resulting in loss of spectral information.

To overcome these limitations, a material should be able to strongly absorb infrared radiation in frequency bands that are tunable with applied voltage. Moreover, the incident absorption should be detectable by a high-speed electronic detection mechanism. No known "bulk" material fulfils all of these requirements.

The two-dimensional material graphene offers some of these attributes due to its unique and tunable band dispersion relation. However, because of the absence of bandgap and single-atom thickness, graphene absorption across the optical spectrum is very weak (<2.3%). Various optoelectronic devices like detectors, modulators, etc. have been proposed and demonstrated based on graphene. However, with such low absorption cross-section, it is unlikely that any one of these devices will become part of a real-world solution. Unless graphene's absorption cross-section is dramatically enhanced while its main properties such as high carrier mobility and fast momentum relaxation time remains constant, graphene is slated to remain a scientific marvel without any practical optoelectronic use.

What is needed is uncooled, tunable, ultrafast mid-IR detection.

BRIEF SUMMARY OF THE INVENTION

The below summary is merely representative and non-limiting.

The above problems are overcome, and other advantages may be realized, by the use of the embodiments.

Various embodiments enable plasmon assisted photothermoelectric detection of infrared radiation that is based on (i) the 30-fold enhanced absorption of infrared radiation up to >60% using a nanostructured graphene sheet coupled with an optical cavity and (ii) the asymmetric heating of the partially patterned graphene sheet by means of the quick conversion of the localized surface plasmon (LSP) excitation energy to hot carrier energy, leading to a directly measurable thermoelectric voltage. Fast response time coupled with an electronically widely tunable absorption in cavity-coupled geometry enables these new classes of graphene-based uncooled photodetectors.

In a first aspect, an embodiment provides a method for ultrasensitive infrared photodetection, infrared imaging, and other optoelectronic applications using the plasmon assisted thermoelectric effect in graphene. The method includes providing an infrared detector. The infrared detector has an asymmetrically patterned graphene layer. The method also includes receiving infrared radiation illumination at the infrared detector and detecting a thermoelectric voltage generated by the received infrared radiation illumination. In respond to detecting the thermoelectric voltage, reception of infrared radiation illumination is indicated.

In another aspect, an embodiment provides a device for ultrasensitive infrared photodetection, infrared imaging, and other optoelectronic applications using the plasmon assisted thermoelectric effect in graphene. The device includes an infrared detector with an asymmetrically patterned graphene layer configured to generate a thermoelectric voltage in response to a received infrared radiation illumination, the infrared detector having a source, drain and gate. A function generator is connected to the source, a lock-in amplifier is connected to the drain, and a gate voltage is connected to the gate.

BRIEF DESCRIPTION OF THE SEVERAL VIEWS OF THE DRAWINGS

Aspects of the described embodiments are more evident in the following description, when read in conjunction with the attached Figures.

DETAILED DESCRIPTION OF THE INVENTION

Figure 1A:
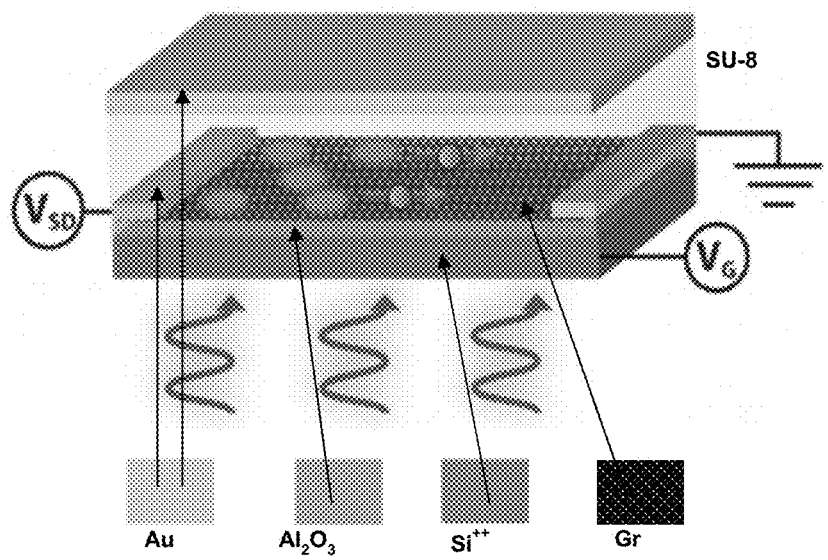
FIG. 1A shows a schematic of the device architecture of the plasmon-assisted hot carrier generation on an asymmetrically nanopatterned graphene and the arrows show hot carrier diffusion processes.

Due to the low photon energy, detection of infrared photons is challenging at room temperature using conventional systems. The thermoelectric effect offers an alternative mechanism bypassing material bandgap restriction. Infrared detection by the photo-thermoelectric effect critically depends on the generation of a temperature gradient ($\Delta T$) for the efficient collection of the generated hot-carriers; however, in theory, the magnitude of $\Delta T$ is limited by the Seebeck coefficient of the material. An asymmetric plasmon-induced hot-carrier Seebeck photodetection scheme at room temperature can exhibit a remarkable responsivity of 2900 V/W, detectivity (D*) of $1.1 \times 10^9$ Jones along with an ultrafast response of 100 ns in the technologically relevant 8-12 µm band, the performance of which compares favorably even with present cryogenically cooled detection schemes. This is achieved by engineering the asymmetric electronic environment of the generated hot carriers on chemical vapor deposition (CVD) grown large area nanopatterned monolayer graphene, which leads to a record $\Delta T$ of 4.7 K across the device terminals, thereby enhancing the photo-thermoelectric voltage beyond the theoretical limit for graphene. The results provide a novel strategy for uncooled, tunable, multispectral infrared detection.

Two-dimensional (2D) materials, especially graphene, have shown a lot of potential as candidate materials for infrared detection. An ultrafast (~ps) infrared detection process is to excite hot-carriers in the absence of carrier-phonon scattering and probe the electronic temperature of graphene for infrared sensing by exploiting the photo-thermoelectric effect. Upon illumination, the intrinsic carrier temperature of graphene increases ($\Delta T$) by means of hot carrier generation that manifests as a Seebeck voltage, $\Delta V$. Despite the proof-of-concept demonstrations, so far, due to the modest Seebeck coefficient of graphene, ~100 µV/K, it has not been possible to harness this effect as an effective approach that can rival contemporary technologies.

The temperature gradient ($\Delta T$) of the charge carriers can be engineered with minimal effect on the lattice temperature in order to enhance Seebeck voltage generation for highly sensitive, spectrally tunable, ultrafast infrared detection in the long wavelength infrared (LWIR) band at room temperature. The carrier temperature of graphene at a specific spectral range can be manipulated by the plasmonic excitation of Dirac fermions which can be controlled by electrostatic tuning of the Fermi level. Spectrally tunable infrared absorption of 60% in the LWIR was demonstrated for nanopatterned monolayer graphene coupled to an optical cavity. At resonance, due to the strong confinement of electric field at the discrete nanoresonator edges, the electronic system of graphene heats up by means of boundary-assisted intraband Landau damping to generate hot-carriers. Although the hot-carrier generation develops a change in conductance of graphene, the resultant photoresponse arising from $\Delta T$ is limited by the theoretical Seebeck coefficient of graphene. An asymmetric plasmon-induced hot-carrier Seebeck photodetection mechanism can overcome the theoretical limitation. In the asymmetric device, shown in FIG. 1A, the active detector area consists of a partially nanopatterned monolayer graphene, such that there exists a temperature gradient between the hot carriers in the patterned and the unpatterned regions. In addition to the temperature rise from intrinsic intraband hot carrier generation in graphene, the plasmon-assisted hot carriers in the patterned section further enhances the effective temperature gradient, $\Delta T$, across the source-drain contacts. Owing to this enhanced record $\Delta T$ generation, the fabricated LWIR detectors exhibit an outstanding room temperature responsivity of 2900 V/W, detectivity, D*, of $1.1 \times 10^9$ Jones along with an ultrafast response of 100 ns.

Plasmon Assisted Hot Carrier Generation

The plasmon assisted photo-thermoelectric (PTE) detector design and the fundamental electronic processes involved are schematically shown in FIG. 1A. A monolayer graphene between the source and drain electrodes forms the active detector surface where a section of the graphene is patterned into a hexagonal array of holes. In doing so, an asymmetry is inherently introduced into the system that assists infrared detection as explained below. Selective patterning of graphene allows enhanced infrared absorption arising from localized Dirac plasmon excitations associated with intraband transitions. As a result, a gradient is introduced into the charge carrier density of the graphene channel across the source-drain electrodes. This creates a temperature difference across the graphene channel that plays a role in the infrared detection mechanism.

Figure 1B:
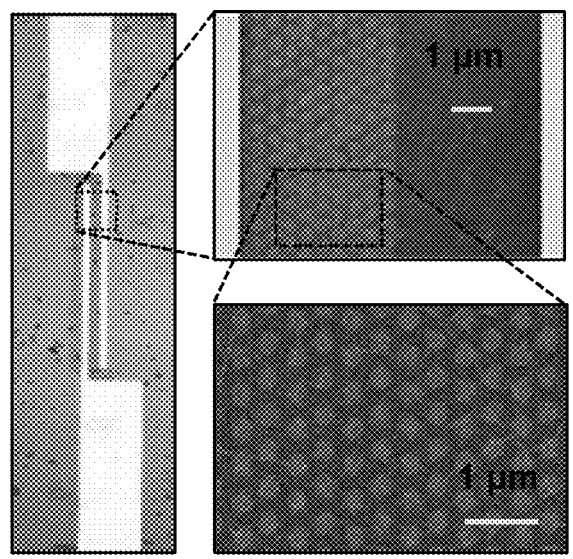
FIG. 1B shows microscope images of the half-patterned graphene sample.

Based on the applied source-drain voltage, ($V_{SD}$), henceforth called bias voltage, and the gate voltage, $V_G$, multiple electronic processes that influence the detector response work in tandem or against each other. The graphene channel width is chosen to be 10 µm which is comparable to the diffusion length of the charge carriers. However, in order to enhance carrier collection, the graphene channel width is elongated to maintain an effective active area of 2000 µm² as shown in FIG. 1B. The nanopattern geometry of period P=600 nm and hole diameter D=400 nm was chosen in the detector fabrication. The scanning electron microscope (SEM) images (see FIG. 1B-right) reveal the hexagonal array of holes in the patterned section along the graphene channel.

The Fermi energy of graphene at 0V is determined to be −0.6 eV which suggests that the graphene sheet is self-doped to be p-type. Such self-doping effects have been reported to arise due to residual impurities on the graphene surface. In addition, the $Al_2O_3$ gate dielectric is known to enhance p-type doping in graphene. Therefore, as the gate voltage is swept from +1V to −2V, the hole concentration on graphene increases consistent with a change in Fermi energy from −0.55 eV to −1.0 eV. Nanopatterning decreases the carrier mobility of graphene.

Figure 1C:
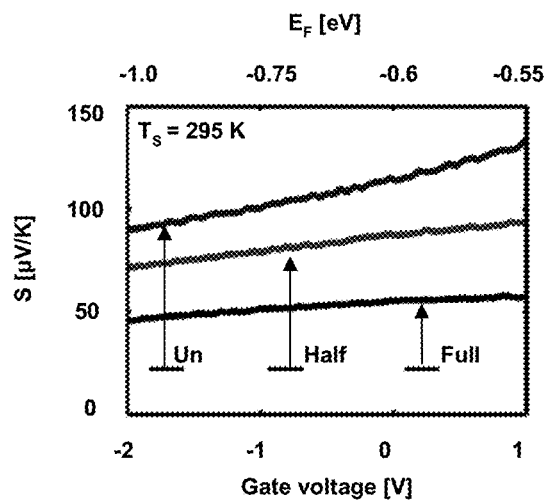
FIG. 1C shows Seebeck coefficient of the unpatterned, half-patterned and full-patterned graphene samples (P=600 nm and D=400 nm) as a function of gate voltage at room temperature.
Figure 9:
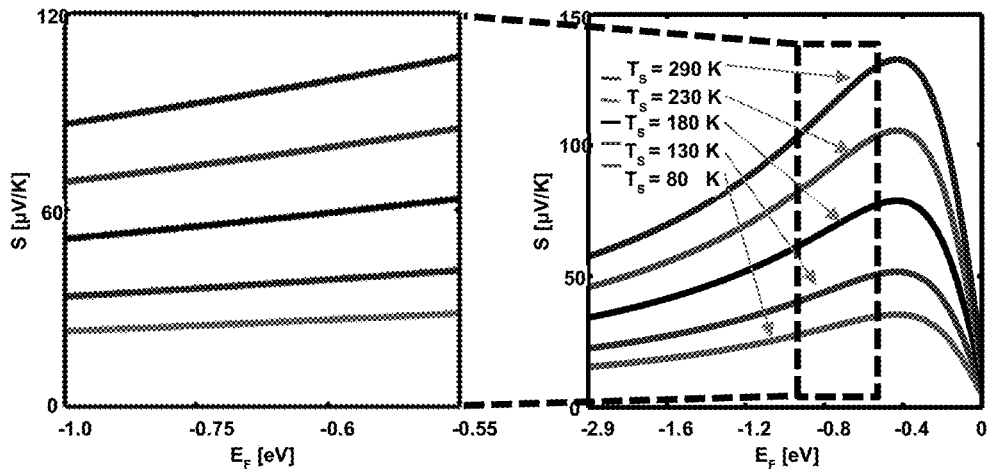
FIG. 9 demonstrates the Seebeck coefficient of full-pattern graphene samples as a function of gate voltage for different substrate temperatures.

The experimentally extracted Seebeck coefficient, S, of different graphene devices as a function of Fermi energy, which proves that nanopatterning decreases the Seebeck coefficient, is shown in FIG. 1C. It can be observed that by electrostatically increasing the p-doping, as the Fermi energy is lowered, the Seebeck coefficient decreases, which is consistent with previous reports on graphene doped away from the charge neutrality point. It can also be noticed that with decrease in temperature, S diminishes, as shown in FIG. 9, which makes the present detection scheme more efficient at room temperature.

Photovoltage Generation

Upon illumination with infrared light, the electronic properties across the half-patterned graphene channel exhibit contrasting electronic behavior. When light is incident on the unpatterned section of the graphene channel coupled to an optical cavity, the light absorption is a modest ~3%; however in the patterned section, owing to Dirac localized surface plasmon (LSP) excitations, ~60% light is absorbed by way of the strong confinement of electric field near the nanohole edges.

Figure 11A:
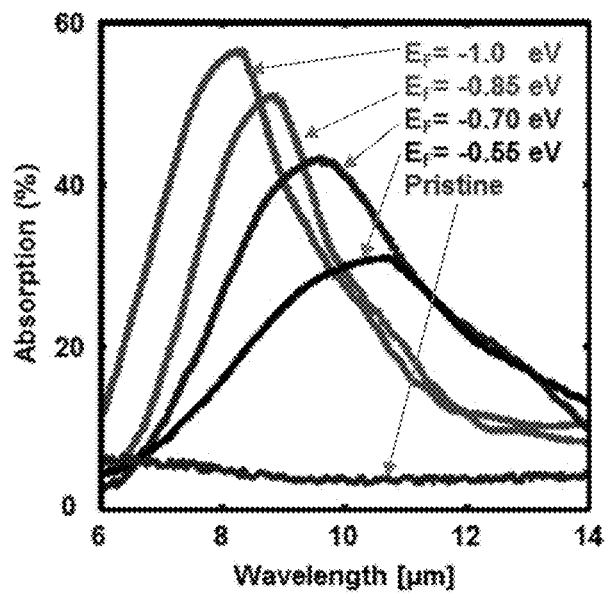
FIG. 11A shows experimental results of enhanced light-matter interaction where the measured light absorption of the cavity-coupled graphene nanohole array with P=600 nm, D=400 nm and L=1.3 µm for different Fermi energies.
Figure 11B:
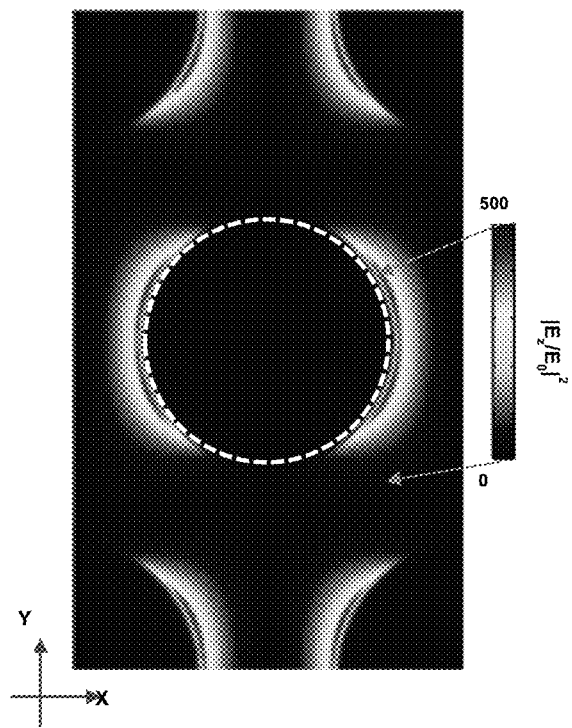
FIG. 11B shows a FDTD simulated top view of the z-component near-field profile at $E_F=-1.0$ eV.

FIGS. 11A-B demonstrate that the absorption peak location is tunable over ~2.5 µm in the 8-12 µm band by electrostatic doping. Once excited, the LSPs dissipate energy through various damping pathways like phonon emission, bulk scattering or carrier-carrier edge scattering that influence either the lattice or carrier temperature of graphene depending on which of the above-mentioned damping mechanisms are dominant. Since the LSP excitations, 115-155 meV, occur at energies lower than the optical phonon energy of graphene, 200 meV, and far from that of the substrate, ~105 meV, plasmon damping through emission of optical phonon has negligible effect. Therefore, the plausible pathway for the plasmon damping is by generation of hot carriers via edge scattering-assisted Landau damping and resistive loss due to electron-impurity and electron-acoustic phonon scatterings.

Multiple factors that determine the effective thermoelectric response of this complex system when irradiated with infrared light now contribute to the asymmetric environment within the graphene channel. First, there exists the photo-thermoelectric effect originating from the intrinsic Seebeck coefficient of graphene, $S_1$. Second, the half-patterned graphene channel can be treated as a region consisting of two series of connected thermoelectric materials with different Seebeck coefficients (see FIG. 1C) for the unpatterned, $S_1$, and patterned, $S_2$, sections which drives the system further into thermoelectric imbalance. The different Seebeck coefficients of the two sides induce a directional photo-thermoelectric current accompanied by the bias current. The resulting potential gradient can be expressed as a function of the channel width, $X_L$-$X_R$ $$V_S = \int_{X_L}^{X_R} S \cdot x \frac{\partial T_{cr} \cdot x}{\partial x} dx \quad (1)$$

where $X_L$ and $X_R$ are the positions of the left and right contacts, respectively, and $T_{cr}$ is the local carrier temperature. Finally, the different carrier mobilities of the patterned and unpatterned sections of the channel lead to differential Joule heating during carrier transport, which further enhances the thermal gradient in the system by increasing the temperature-dependent Seebeck coefficients in the patterned and unpatterned regions.

Figure 1D:
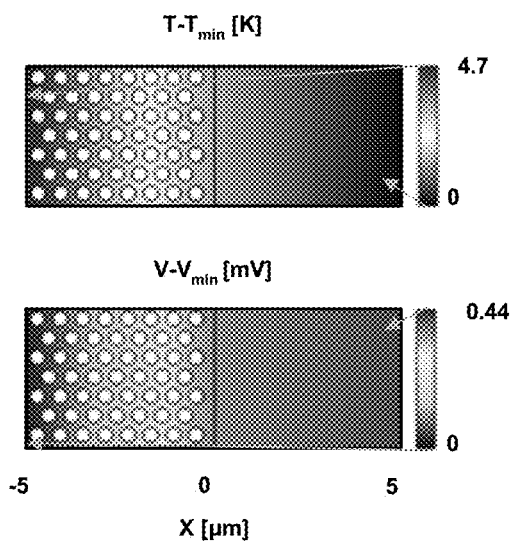
FIG. 1D shows the simulated temperature (top) and potential (bottom) profiles of the graphene detector at $E_F=-0.85$ eV, $\lambda_{res}=8.15$ µm and $V_{SD}=0.9$ V.

Taking the above factors into consideration, finite element modelling (FEM) was done at 295 K using COMSOL and revealed a net temperature difference of ΔT~4.7K for the incident power of 153 nW where the patterned section has elevated temperature (as can be observed in FIG. 1D). This ΔT across the channel yielded a photo-thermoelectric voltage $V_{PTE}$ of ~0.44 mV. During the simulation, the Fermi level of graphene was maintained at −0.8 eV, and a bias voltage $V_{SD}$=0.9V was applied. Due to the biasing, both plasmon-assisted thermoelectric and bolometric effects contribute to the resultant D.C. response of the graphene channel. In order to probe only the photo-thermoelectric voltage, $V_{PTE}$, a measurement strategy was employed that eliminated bolometric effects from the signal.

Figure 1E:
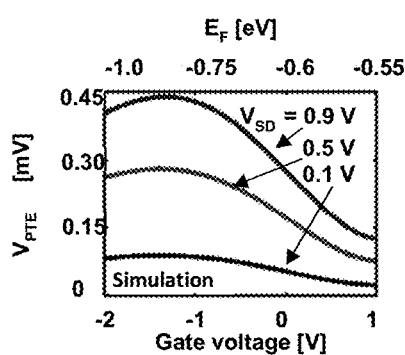
FIG. 1E shows the simulated D.C. responsivity of the graphene detector as a function of Fermi energy for the different bias voltages.

FIG. 1D shows the profile of ΔT and $V_{PTE}$ obtained across the graphene channel. Generation of such a high position-dependent ΔT at room temperature exceeds previously reported values by an order of magnitude. A series of FEM simulations was performed to investigate the role of Fermi energy and bias voltage on the photo-thermoelectric effect (see FIG. 1E). By increasing the bias voltage, the hot-carriers transport enhances significantly such that $V_{PTE}$ increases as a result of efficient carrier collection at the electrodes. For any bias voltage, as the Fermi energy of the graphene channel is increased from −0.55 eV to −0.8 eV, the photo-thermoelectric voltage increases and then decreases for higher Fermi energies. As mentioned earlier, increase in the Fermi energy enhances the light absorption due to the increase in available states for intraband transition, which enhances hot-carrier generation, or ΔT, and also increases the electrical conductivity of graphene, which increases the Seebeck voltage $V_{PTE}$; however, the resulting $V_{PTE}$ is also a function of Seebeck coefficient, $V_{PTE}$=S $E_F$, ΔT, which monotonically decreases with $E_F$.

Figure 1F:
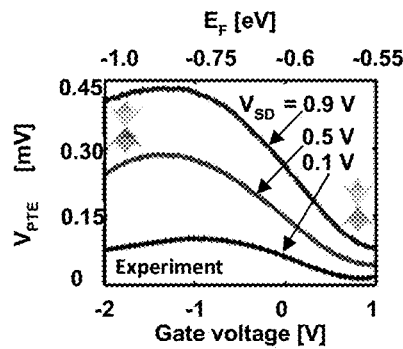
FIG. 1F shows the measured D.C. responsivity of the graphene detector as a function of Fermi energy for the different bias voltages.

Considering these competing effects, there is a trade-off where above a threshold Fermi energy, ~−0.8 eV, the effect of enhanced ΔT on $V_{PTE}$ is negatively impacted by the lower Seebeck coefficient that results in a decrease in $V_{PTE}$. Therefore, there is a range of gate, $V_G$, and bias voltage, $V_{SD}$, for a desired performance of the detector associated with maximum $V_{PTE}$ at a given spectral wavelength, which can be observed from FIG. 1E. The predictions from FEM simulations were validated by conducting experimental measurements to quantify the photo-thermoelectric voltage generated as a function of bias and gate voltages, FIG. 1F. Photoresponse of the detector was measured by illuminating the active area with a broadband light source. An optical bandpass filter is used to eliminate other wavelengths outside of the 8-12 μm band from the broadband incident light. The experimental curves are in excellent agreement with the simulated results, which confirms that the measured signal arises from the Seebeck effect.

D.C. Photoresponse

Figure 2A:
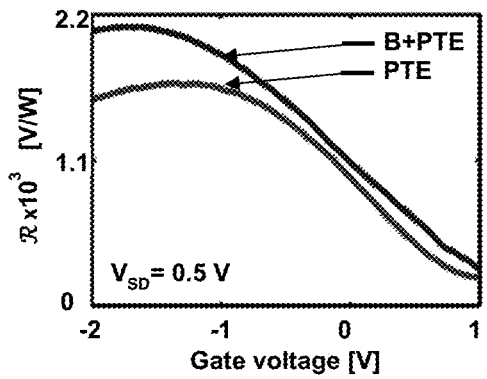
FIG. 2A shows a, D.C. responsivity from photo-thermoelectric (PTE) and combined photo-thermoelectric and bolometric (B+PTE) effects as a function of gate voltage at room temperature and $V_{SD}=0.5$ V.
Figure 2B:
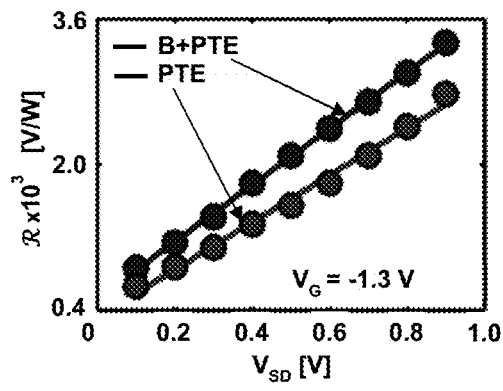
FIG. 2B shows D.C. responsivity as a function of bias voltage for gate voltage, VG=−1.3 V.
Figure 2C:
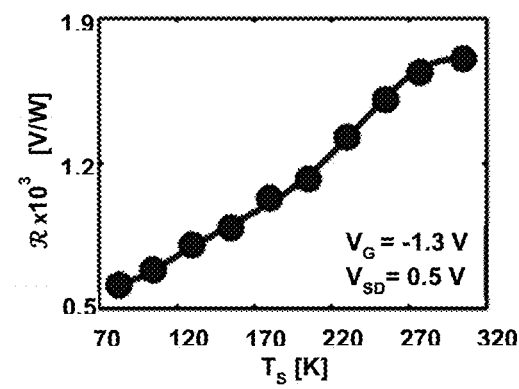
FIG. 2C shows D.C. responsivity as a function of substrate temperature for gate voltage, VG=−1.2 V.

The room temperature D.C. performance of the detector was characterized by the responsivity, $\mathcal{R}_{D.C}$=$V_{PTE}$/$P_{inc}$, for different bias voltages, $V_{SD}$, and substrate temperatures, $T_S$, where $P_{inc}$ is the band-limited incident IR power. The highest responsivity measured in the present work is $2.9 \times 10^3$ V/W (see FIGS. 17A-B) which is over two orders of magnitude larger than previous reports. FIG. 2A shows the combined bolometric and the photo-thermoelectric response where the total responsivity increases by 30% above the photo-thermoelectric effect alone. The responsivity follows the same trend as $V_{PTE}$ and scales linearly with the applied bias voltage for both thermoelectric and combined thermoelectric-bolometric signals, FIG. 2B. Next, the effect of ambient temperature on the photoresponse of the detector was investigated; where $\mathcal{R}$, $V_G$, curves were recorded at regular temperature intervals within the range of 80-320 K. As the temperature is decreased, the responsivity reduces as shown in FIG. 2C. This is in contrast to the bolometric devices where cooling improves responsivity.

In various embodiments, the absorption of light is almost independent of temperature; in other words, the hot-carrier generation and subsequent development of ΔT remains unaffected by the temperature of the sample. However, the Seebeck coefficient of graphene decreases as the temperature is lowered (see FIG. 9); consequently, for the same ΔT, the magnitude of $V_{PTE}$ decreases gradually from 320 K to 80 K. Therefore, the responsivity of the detector decreases as the temperature is lowered, which provides additional evidence that the Seebeck effect is indeed the dominant phenomenon in the present detection scheme.

Figure 2D:
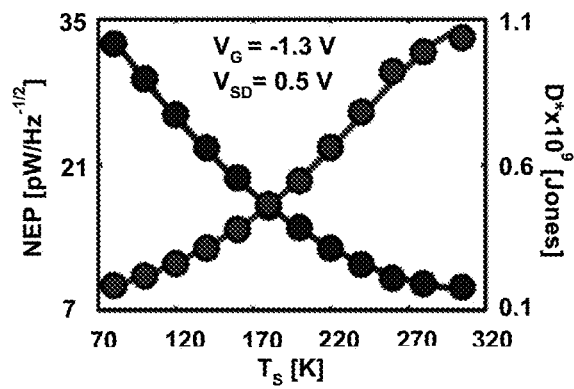
FIG. 2D shows the noise equivalent power (NEP) and specific detectivity (D*) of the half-patterned graphene detector as a function of the substrate temperature.

Noise equivalent power (NEP) is calculated by measuring the noise spectral density, $S_n$, and the responsivity, NEP=$S_n$/$\mathcal{R}$, of the detector for different substrate temperatures (see FIG. 2D). Typically, thermal detectors suffer from high NEP at room temperature, which is why they are cooled for better performance. In contrast, as shown in FIG. 2D, various embodiments exhibit lowest NEP at room temperature and an increase in NEP is observed upon lowering the substrate temperature. The NEP, ~7 pW/Hz$^{-1/2}$, is more than one order of magnitude lower than thermal photodetectors, which establishes its superiority as an uncooled, room-temperature mid-IR photodetector. The specific detectivity, D*, is derived from the NEP and the detector active area (a) as D*=$\sqrt{A}$/NEP [cm $\sqrt{HZ}$/W] or [Jones]. The maximum D* at $E_F=-0.8$ eV and $V_{SD}=0.9$ V is measured to be $1.1 \times 10^9$ Jones (see FIG. 2D), which clearly outperforms all graphene-based MIR photodetectors reported till date.

A.C. Photoresponse

To further elucidate the role of LSPs in hot carrier generation and how the asymmetric design excels in creating a high responsivity detector, the A.C. photoresponse of three detectors that were fabricated with (i) half-patterned, (ii) full-patterned and (iii) unpatterned graphene channels, respectively, are compared. For the unpatterned and full-patterned detectors, the photoresponse primarily arises from the bolometric effect. Furthermore, owing to the symmetric design of the unpatterned and full-patterned devices, the polarity of bias voltage should not affect the photoresponse. In contrast, due to the asymmetric architecture of the half-patterned detector, a bias voltage in the direction of $\Delta T$ favors the collection of hot-carriers compared to the opposite bias. For the zero-bias condition, the asymmetric case yields a finite photoresponse; however, the symmetric cases should result in zero photoresponse owing to omnidirectional scattering of hot carriers.

Figure 3A:
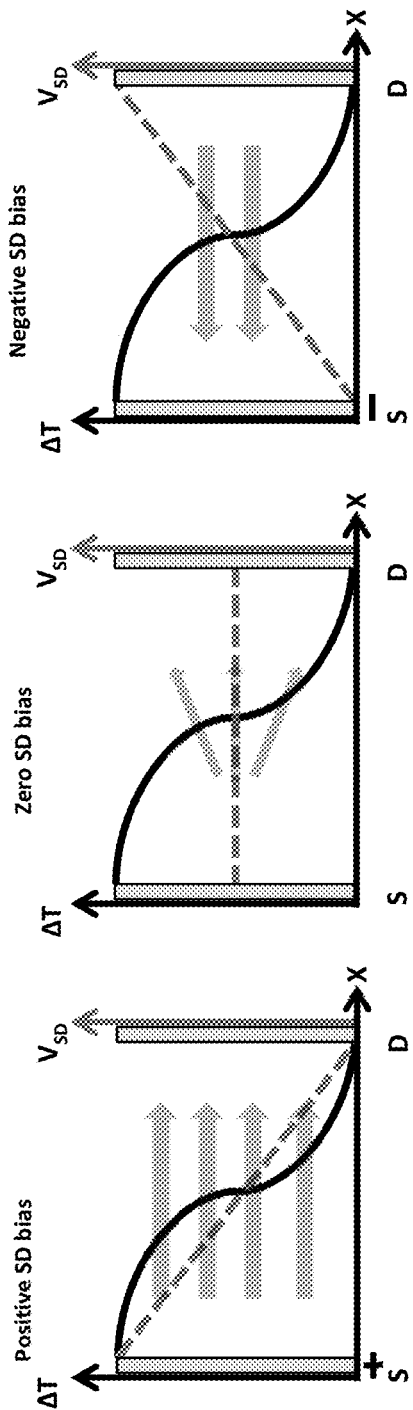
FIG. 3A illustrates a schematic showing the A.C. photocurrent for different measurement conditions.
Figure 3B:
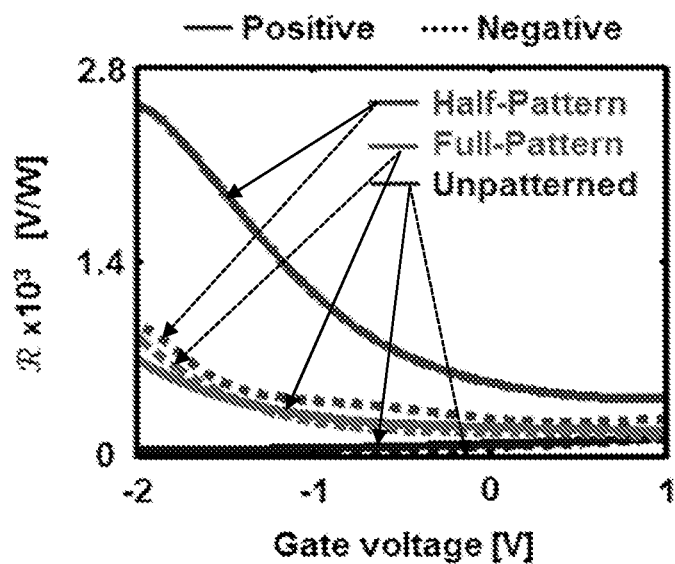
FIG. 3B shows A.C. responsivity of the half-patterned, full-patterned and unpatterned graphene detectors for the positive (solid) and negative (dashed) offsets (0.25 V) at f=20 Hz.

FIG. 3A schematically illustrates hypotheses that were tested by the following measurements. The experimentally measured responsivity at f=20 Hz shown in FIG. 3B confirms the working hypothesis. The full-patterned device exhibited higher responsivity than the unpatterened device, which is attributed to the enhanced infrared absorption. On the other hand, the half-patterned device showed significantly improved responsivity arising from higher $\Delta T$ across the graphene channel. In addition, it can be seen that the polarity of bias voltage has significant effect on the responsivity of the half-patterned device, unlike the symmetric full-patterned and unpatterned devices. The positive bias condition, source voltage: 0 to 0.5V, assists the drift of the hot-carriers, holes, generated on the patterned section towards the drain, ground; whereas in the negative bias condition, source voltage: 0 to −0.5 V, the flow of holes towards the drain, ground, is inhibited leading to diminished responsivity as shown in FIG. 3B.

Figure 3C:
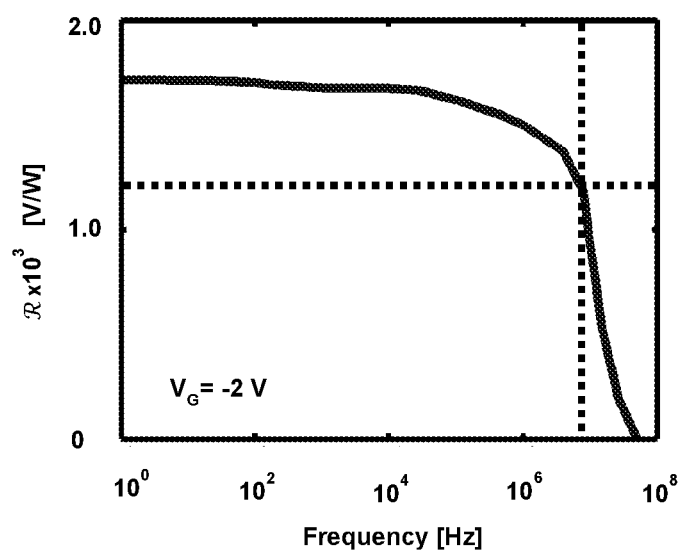
FIG. 3C shows A.C. responsivity as a function of frequency for $V_G=-2V$, where the crosshair shown in dashed lines corresponds to the cut-off frequency.

The time response of the half-patterned detector was measured to quantify the operational bandwidth. Due to the ultrafast plasmonic excitation and charge transport in graphene, a fast photoresponse is expected. Since light modulation by mechanical chopping was not a feasible technique for high speed measurements, the A.C. photoresponse is studied by electronic modulation of the source-drain bias from 200 Hz to 100 MHz. The corresponding A.C. responsivity as a function of frequency is shown in FIG. 3C. A constant responsivity up to 8 MHz corresponding to a 3 dB cut-off time constant of $\tau_{res}=125$ ns is observed. The measured time constant is larger than the Dirac plasmon lifetime, $\sim 10^{-15}$ sec, and is limited by the capacitance of the external circuitry.

Figure 4A:
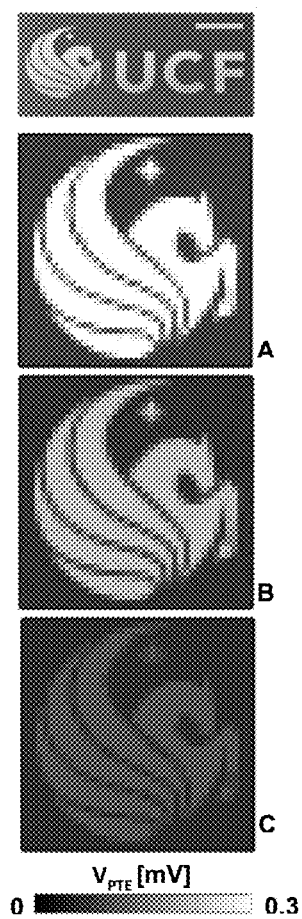
FIG. 4A shows the single-pixel imaging results, for different gate voltages, where the yellow scale bar shows 5 mm.
Figure 4B:
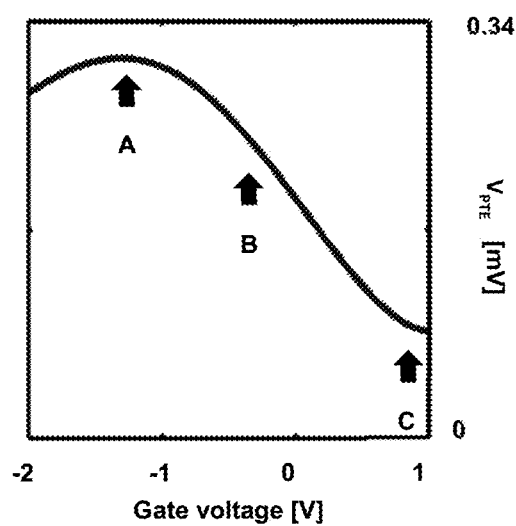
FIG. 4B shows the contrasts of the images scale according to the photo-thermoelectric voltage as a function of gate voltage.
Figure 4C:
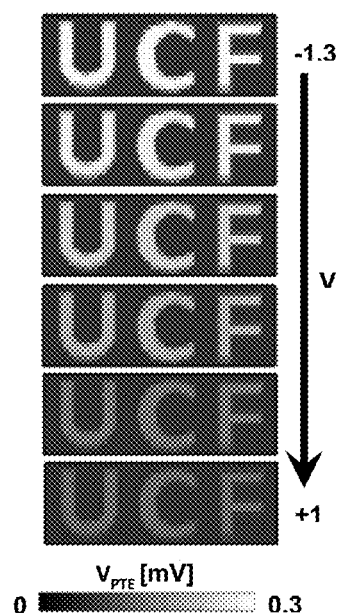
FIG. 4C shows the single-pixel imaging results focused on a different aspect of the top image of FIG. 4A, for different gate voltages.

The asymmetric graphene device is a multispectral gate tunable infrared detector. This opens up the possibility for making an uncooled multi-pixel infrared camera with performance comparable to the commercial cooled cameras. To demonstrate the real performance of the photodetector, a single-pixel imaging method was used to image a Pegasus and UCF logo printed on a substrate. The tunable response of the detector is evident from greyscale images shown in FIGS. 4A-C.

Conclusions

In conclusion, various embodiments provide outstanding room temperature photodetection using 2D monolayer graphene that is possible by the interplay between multiple physical phenomena: (i) tunable enhanced infrared absorption induced by localized Dirac plasmonic excitations, (ii) graphene mobility engineering and, (iii) excitation of asymmetric hot carriers and consequent electronic photo-thermoelectric effect. The asymmetric graphene channel design facilitates generation of high temperature gradient, $\Delta T \sim 4.7$K, $=153$ nW, which enables the remarkable photoresponse. Various processes that contribute to the photoresponse and provide the ultrafast, $\tau_{res} \sim 100$ ns, high responsivity, 2900 V/W, and high $D^* \sim 1.1 \times 10^9$ Jones can be attributed to the photo-thermoelectric effect. The frequency-tunable graphene detectors not only offer spectroscopic detection but also pave the path towards dynamic multi-spectral imaging in the IR domain, which is lacking in the present IR imaging technologies.

Method Section

Fabrication

The large-scale monolayer graphene grown by chemical vapor deposition, CVD, method on copper foil was transferred to the $Si^{++}$, 100 $\mu$m/$Al_2O_3$, 15 nm, substrate. The source and drain contacts were fabricated by UV-lithography following by Ti/Au, 3 nm/60 nm, deposition. Electron beam lithography (EBL) followed by oxygen-plasma etching techniques was used to nanopattern the half side of transferred graphene with period P=600 nm and diameter D=400 nm.

D.C. Photo-Thermoelectric Voltage Measurement

Figure 15:
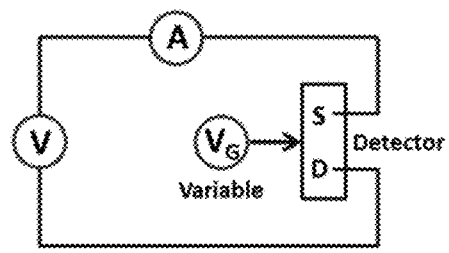
FIG. 15 shows the circuit used to measure D.C. response.
Figure 16:
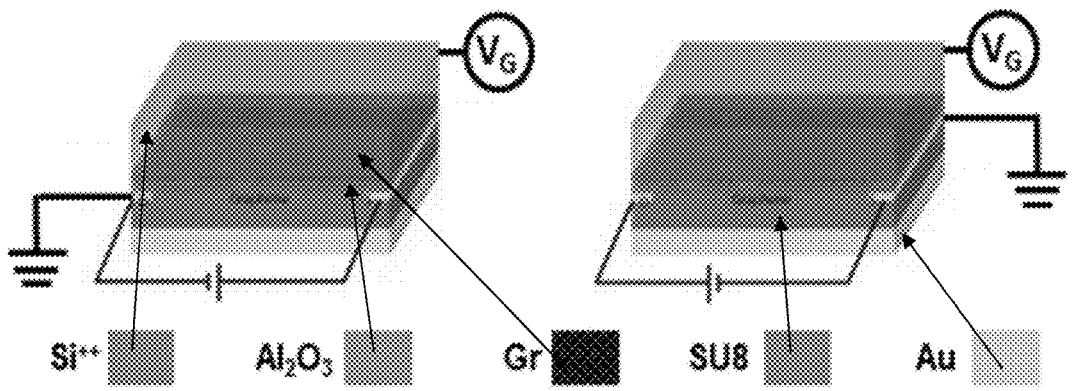
FIG. 16 shows the schematic of the circuits used to measure the D.C. currents which correspond to the bias voltages with opposite polarities.

For a fixed gate voltage, a D.C. bias voltage, $V_{SD}$, was applied across the source-drain, SD, terminals and the resulting current $I_1=I+I_{TE}$ and $I_2=-I+I_{TE}$ was measured for applied voltage$\pm V_{SD}$, where I is the current generated by the bias voltage and $I_{TE}$ is the thermoelectric current, $I_{TE}=I_1+I_2/2$. This thermoelectric current was measured in the dark, $I_{TE-D}$, and in the presence of mid-IR light, $I_{TE-L}$. Any contribution due the photoconductive effect is expected to be independent of the polarity of applied bias voltage, which was thereby eliminated in the $I_{TE-L}$ calculation. Therefore, the photo-thermoelectric current and voltage can be calculated as $I_{PTE}=I_{TE-L}-I_{TE-D}$ and $V_{PTE}=R_G I_{PTE}$, respectively. The D.C. responsivity, $\mathcal{R}_{D.C}=V_{PTE}/P_{inc}$, was calculated by using the measured incident light power, $P_{inc}$, the gate-tunable graphene resistance, $R_G$, and $I_{PTE}$. The circuit diagram is shown in FIG. 15.

A.C. Photoresponse Measurement

Figure 20A:
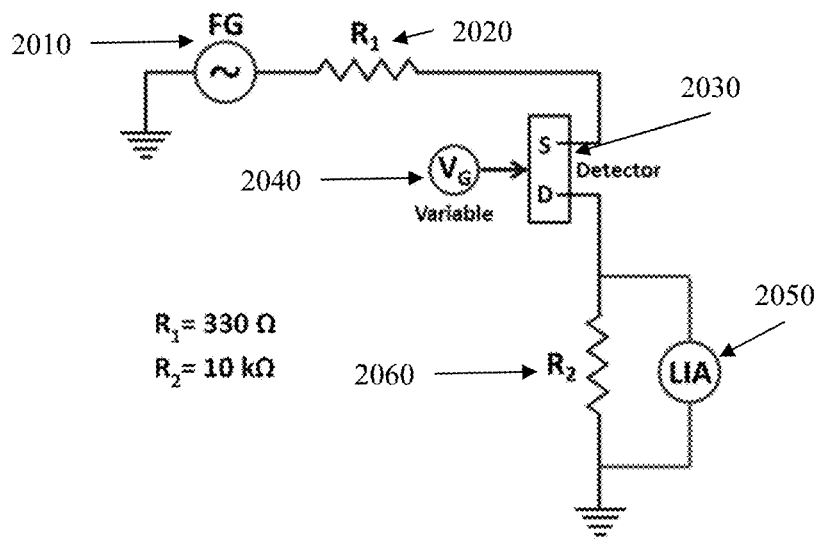
FIG. 20A illustrates the circuit used to measure A.C. response.

The circuit diagram for A.C. photoresponse is shown in FIG. 20A. In the measurement setup, the sample was placed in front of a broadband blackbody source with a 8-12 $\mu$m filter in between. The Fermi level of graphene was fixed by applying a constant gate voltage. First, a sinusoidal bias voltage with a positive offset of 0.25 V was applied in dark to the source-drain terminals. Due to this, an A.C. voltage was developed across resistor $R_2$ that was at the same frequency as the input bias voltage $[V_{SD+}^{dark}=0.25+\sin 2\pi f]$. The voltage across $R_2$ was recorded using a lock-in-amplifier. Next, in the presence of light, the voltage across $R_2$ $[V_{SD+}^{light}]$ was measured. The A.C. photovoltage was calculated by taking the difference $[V_{SD+}^{PV}=V_{SD+}^{light}-V_{SD+}^{dark}]$. The term $V_{SD+}^{PV}$ includes photoresponse from both photo-thermoelectric and photoconductive effects. Therefore, similar to the D.C. responsivity measurement protocol, in order to eliminate the photoconductive effect, the A.C. photovoltage, was measured for a negative offset bias voltage, and the difference $V_{SD+}^{PV}-V_{SD-}^{PV}$ yields the A.C. photo-thermoelectric voltage, which is plotted in FIGS. 3A-C.

FEM Simulation

The COMSOL Multiphysics 5.3a software was used to simulate the performance of the detector. The overall goal of simulations was to find the time dependent solution for the bias-dependent photo-thermoelectric current, which was further used to calculate the photo-thermoelectric voltage, $V_{PTE}$, and the responsivity $R=V_{PTE}/P_{inc}$. The built-in modules "Electric Currents" and "Heat Transfer in Solids" coupled with the multiphysics module "Thermoelectric Effect" were applied to predict the behavior of the detector.

The sample geometry in the simulations was identical to the real detector except for the length of the simulated detector, which was decreased to 20 µm as compared to 200 µm in the experiment, in order to reduce the computation time. The simulated detector was 20 µm wide, contacts and graphene, and 20 µm long. The channel width of the detector was 10 µm wide and 20 µm long, where half of the width of the graphene sheet was patterned, and the other half kept unpatterned. The gold terminals were 5 µm by 20 µm, and the thicknesses of graphene, gold contacts, aluminum oxide, and silicon were 0.5 nm, 50 nm, 15 nm, and 3 µm, respectively. Gold, Silicon, and Aluminum oxide materials were directly imported from the COMSOL material library, while the experimentally measured parameters were used for graphene. The electrical conductivity and Seebeck coefficient were gate-dependent for graphene, measured experimentally for the patterned and unpatterned graphene separately. The temperature independent electrical conductivity was used for all materials to disregard the bolometric effects.

The bias voltage was applied across the gold terminals; one side was set to ground, and the other at high potential. Except gold terminals and graphene, everything was considered electrically insulated. The current conservation boundary condition was applied for the whole geometry, and the initial values were set to V=0. In order to add the contact resistance, the electrical contacts were introduced between gold and graphene. The heat flux was applied in the form of rectangular pulse of period 4 ms, which means for the first two milliseconds the heat flux was zero, corresponding to the dark state in the experiment. For the next two milliseconds nonzero heat flux was applied on the patterned side of graphene using laser heating. A Gaussian beam with the spot size $R_{spot}$=2 mm and the incident power $P_{inc}$=153 nW was used. The absorbed heat flux depended on the absorption at different Fermi levels. The gate dependence of the light absorption was calculated by using the Lumerical FDTD software, which ranged from A=34% at $E_F$=-0.55 eV to A=60% at $E_F$=-1.0 eV for the patterned graphene.

The bottom side of the detector was kept at a fixed temperature using the boundary condition "temperature" in the software. The initial value of the temperature was set to $T_0$=293.15K, and the boundary condition "open boundary" was used across all the sides of the detector, except top and bottom surfaces, which means the heat can flow inside or outside across the cross-sectional boundary depending on the ambient temperature. Thermal contacts were used between graphene, aluminum oxide and silicon to control heat transfer in the vertical direction. The free tetrahedral mesh for gold and the free triangular mesh at the graphene surface were used, which were swept in vertical direction for the remaining geometry.

The time dependent solver with a very low relative tolerance of $10^{-5}$ was used to measure the time dependent thermoelectric voltage across the terminal for different Fermi energies. The dark and light thermoelectric voltages $V_{TE,D}$ and $V_{TE,L}$ were measured in the absence and presence of the incident heat flux, respectively. The photo-thermoelectric voltage $V_{PTE}$ was then calculated by subtracting the dark from the light voltage, e.g. $V_{PTE}=V_{TE,L}-V_{TE,D}$.

Material Characterizations

Figure 5:
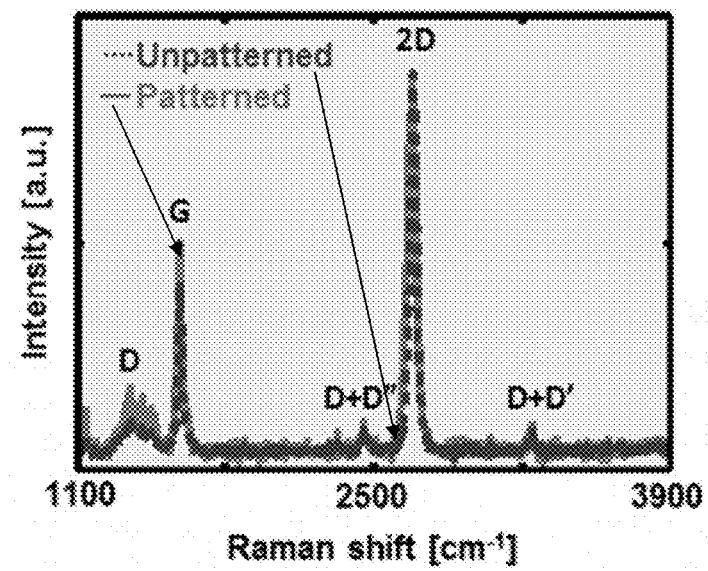
FIG. 5 shows the Raman spectroscopy of the pristine and patterned monolayer graphene, $E_F=-0.6$ eV.

Raman spectroscopy was performed on the transferred graphene to verify if oxygen etching during the nanopatterning process altered the characteristic optical phonon peaks at ~1590, the G peak, and ~2700 cm$^{-1}$. The results in FIG. 5 shows phonon peaks at ~1590, the G peak, and ~2700 cm$^{-1}$ associated with monolayer graphene. FIG. 5 shows the Raman spectra of the pristine, unpatterned, and nanopatterned graphene which confirms the absence of graphene oxide (GO) or reduced graphene oxide (RGO).

Figure 6:
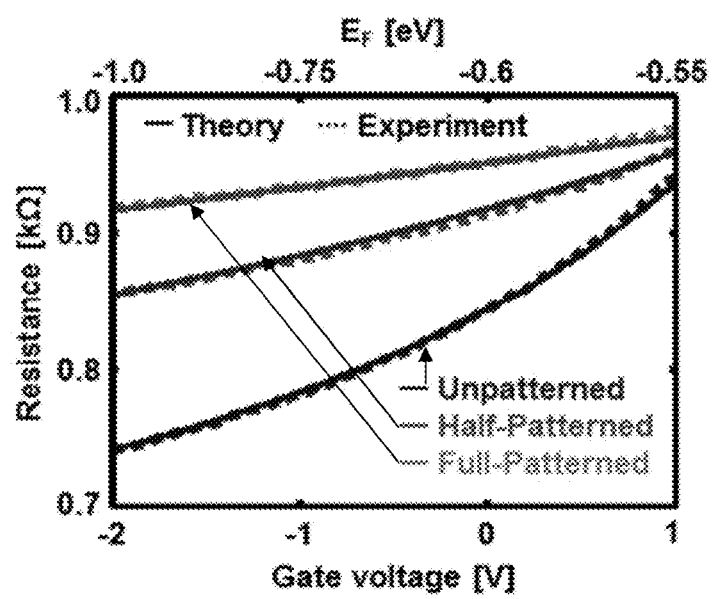
FIG. 6 shows experimental and analytical model diagrams overlaid to find the carrier mobility of the unpatterned, half-patterned and full-patterned graphene sheets.

To determine the experimental value of the Fermi energies at different gate voltages and carrier mobility, the measured resistance of graphene was fitted to the theoretical formula, $R=R_0+1/ne\mu$, as shown in FIG. 6. Here $R_0$ is the minimum resistance at $V_G$=-1 V, n=C$\Delta$V/e is the electron density and e is the Coulomb charge. The high-k gate-dielectric is 15 nm of $Al_2O_3$ with a measured capacitance of C=0.93 µF/cm$^2$ which has a high stability in time[2]. The Fermi energy of graphene at 0V is found to be -0.6 eV, which suggests that the graphene sheet is self-doped to be p-type. In addition, the carrier mobility is determined to be 500 cm$^2$/V·s for the unpatterned channel, which decreases for the half-patterned case, 350 cm$^2$/V·s, and the full-patterned graphene, 250 cm$^2$/V·s, as expected for pattern-induced enhanced scattering. This clearly establishes the effect of nanopatterning on the electronic properties of graphene.

Figure 7:
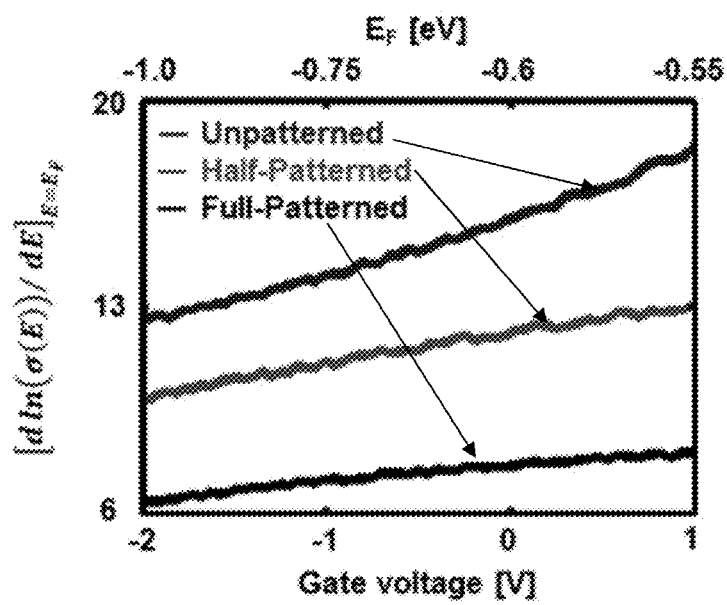
FIG. 7 illustrates the derivative of the conductivity of the graphene channel from the experimentally measured curves.
Figures 8A, 8B, 8C:
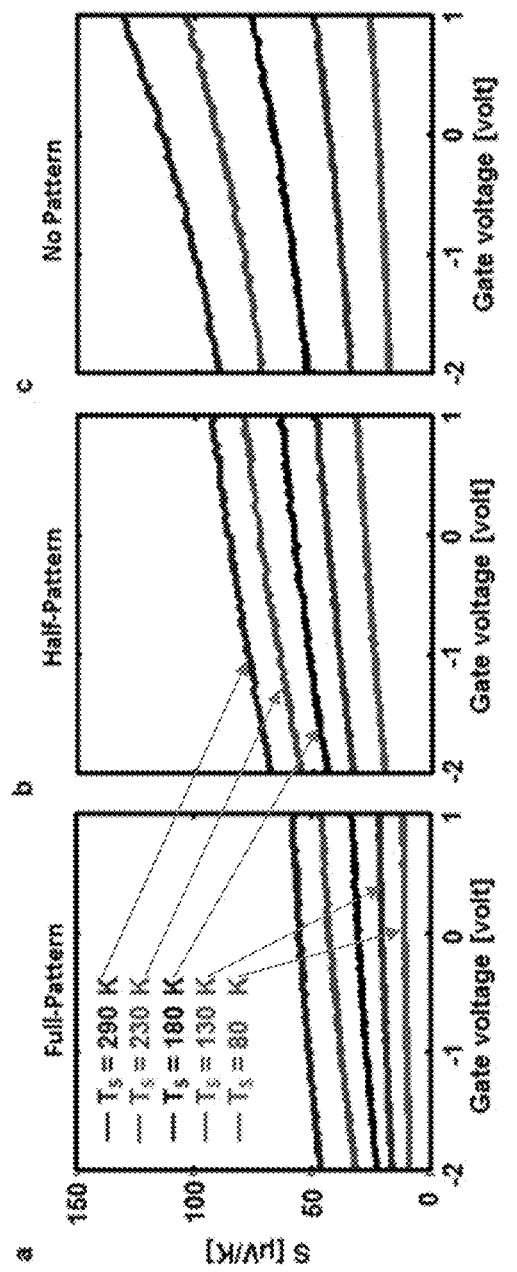
FIG. 8A shows the Seebeck coefficient of a full-pattern graphene sample as a function of gate voltage for different substrate temperatures.
FIG. 8B shows the Seebeck coefficient of a half-patterned graphene sample as a function of gate voltage for different substrate temperatures.
FIG. 8C shows the Seebeck coefficient of an unpatterned graphene sample as a function of gate voltage for different substrate temperatures.

FIG. 7 shows the derivative of the measured conductivity of the graphene channel, $[d \ln(\sigma(E))/dE]_{E=E_F}$, for the unpatterned, half-patterned and full-patterned devices. The Seebeck coefficients for different substrate temperatures was derived by using these derivatives $S=(\pi^2 k_b^2 T/3e^2)[d \ln(\sigma(E))/dE]_{E=E_F}$, as shown in FIGS. 8A-8C, which is a decreasing function of the Fermi energy. The temperature dependence of the Seebeck coefficient is characterized for the half-patterned graphene device which is eventually used for infrared detection. FIGS. 8A-8C show the back-gate dependence of S measured at different temperature intervals in the range of 80 K-300 K. The temperature dependent S of the half-patterned graphene device (see FIG. 8B) follows a similar trend to that reported for pristine graphene (see FIG. 8A), which substantiates that while the magnitude of S may have diminished as a result of nanopatterning (see FIG. 8C), the thermoelectric properties of the half-patterned graphene can be understood from the framework of pristine graphene. To understand the reason of this behavior, the Seebeck coefficient of the pristine graphene was calculated in the range of $E_F$=-2.9 eV to $E_F$=0 eV, for C=0.93 µF/cm$^2$ and µ=500 cm$^2$/V·s. As shown in FIG. 9, the Seebeck coefficient is a polynomial function of Fermi energy which is consistent with previous reports, and is proportional to $$S \propto \frac{T}{\sqrt{n_h}} \propto \frac{T}{E_F}$$

from $E_F$=-1.0 eV to $E_F$=-0.55 eV.

Figure 10A:
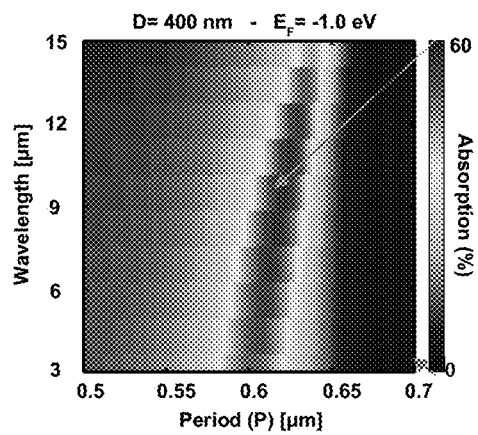
FIG. 10A shows the light absorption as a function of wavelength and period for $E_F=-1.0$ eV.
Figure 10B:
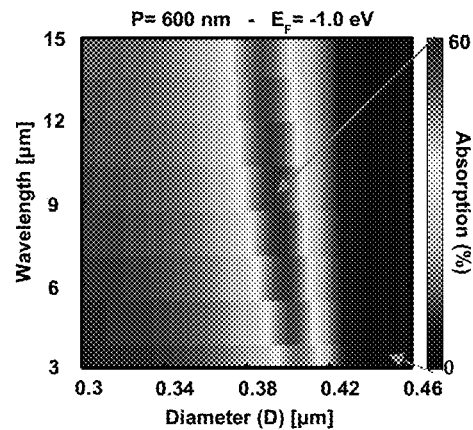
FIG. 10B shows the light absorption as a function of wavelength and diameter for $E_F=-1.0$ eV.

Finite difference time domain (FDTD) simulations were performed over different periods and hole diameters to maximize the infrared absorption in the 8-12 µm band as shown in FIGS. 10A-B. According to the results, the maximum light absorption happens for the hexagonal array in graphene with period P=600 nm and hole diameter D=400 nm.

Figure 12A:
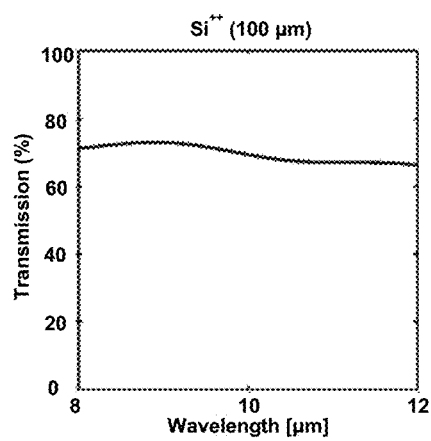
FIG. 12A a characterization of the silicon and gate dielectrics where the light transmission spectrum of $Si^{++}$ with thickness of 100 µm.
Figure 12B:
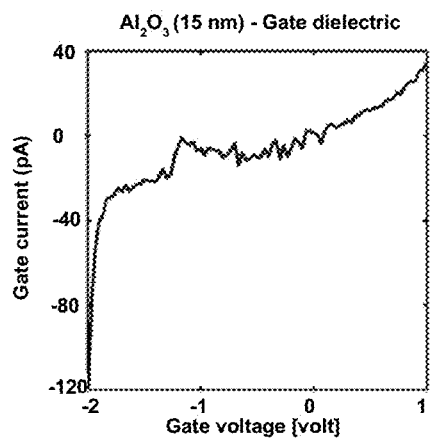
FIG. 12B shows the gate leakage electric current of the 15 nm thick layer of $Al_2O_3$.

Illuminating light on the cavity-coupled graphene with hexagonal array of nanohole excites LSP and confines the field on the edges of the nanoholes to generate hot-carriers. The light absorption and LSPR frequency are independent of the polarization and the incident angle of light, $\theta_i$, for $\theta_i \leq 50°$. The gate-tunable light absorption spectra of the cavity coupled nanopatterned graphene is electrostatically tunable, $\Delta\lambda_{res}$=2.5 µm, with maximum value of ~60%, as shown in FIG. 11A along with the absorption of a cavity-coupled unpatterned graphene. For nanoholes, the extraordinary near-field enhancement by a factor of 500, as shown in FIG. 11B, highlights the extraordinary light-matter interaction. FIG. 12A shows the silicon substrate has ~70% light transmission in the desired spectrum window, 8-12 µm. The leakage current of the gate-dielectric is an important factor in power usage which is very low, ~$10^{-11}$ A, for the 15 nm thick layer of the grown $Al_2O_3$, as shown in FIG. 12B.

FIG. 11A shows experimental results of enhanced light-matter interaction of the measured light absorption for the cavity-coupled graphene nanohole array having P=600 nm, D=400 nm and L=1.3 µm at different Fermi energies. The lower curve shows the light absorption of a cavity-coupled pristine graphene. FIG. 11B shows an FDTD simulated top view of the z-component near-field profile at $E_F$=−1.0 eV.

The maximum value of the bias voltage is limited by the breakdown current density of graphene, which in this case is 12 A/cm²; hence, 0.9 V was chosen as the upper limit for the bias voltage for an active detector area of 10×200 µm².

Simulation

The COMSOL Multiphysics 5.3a software was used to simulate the performance of the detector. The overall goal of simulations was to find the time dependent solution for bias-dependent photothermoelectric voltage, which was further used to calculate the photothermoelectric voltage, $V_{PTE}$, and the responsivity R=$V_{PTE}/P_{inc}$, where $P_{inc}$ is the power of the incident light. The built-in modules "Electric Currents" and "Heat Transfer in Solids" coupled with the multiphysics module "Thermoelectric Effect" were used to simulate the photothermoelectric process in the graphene detector. There are different coupled equations in these modules to solve and find the electric potential, V, and temperature, T:

$$E = -\nabla V, \quad (1)$$

$$\nabla \cdot J = 0, \quad (2)$$

$$J = \sigma E + \frac{\partial D}{\partial t} + J_e, \quad (3)$$

$$\rho c_p \frac{\partial}{\partial t} T + \rho c_p u \cdot \nabla T - \nabla \cdot q = Q, \quad (4)$$

$$q = -k\nabla T, \quad (5)$$

$$\prod = ST, q = \prod J, \text{ and } J_e = -\sigma S \nabla T, \quad (6)$$

where J is the current density, E is the electric field, D is the displacement field, S is the Seebeck coefficient, and n is the Peltier coefficient. $J_e$ is an external current density, contributed by the generated hot electrons. The other constants $\sigma$, $\rho$, $c_p$, and k represent the electrical conductivity, the mass density, the specific heat capacity at constant pressure, and the thermal conductivity, respectively. Moreover, q is the conductive heat flux, Q is the heat source, or sink, and u is the velocity field defined by the translational motion subnode when parts of the model are moving in the material frame.

The sample geometry in the simulated device was identical to the real detector except for the length, which was decreased to 20 µm as compared to 200 µm in the experiment, in order to reduce the computation time. The channel width of the detector was 10 µm wide and 20 µm long, where half of the width of the graphene sheet was patterned, and the other half was unpatterned. The gold terminals were 5 µm by 10 µm, and the thicknesses of graphene, gold contacts, aluminum oxide and silicon were 0.5 nm, 50 nm, 15 nm, and 3 µm, respectively. Gold, Silicon and Aluminum oxide materials were directly imported from the COMSOL material library, while the experimentally measured parameters were used for graphene. As explained in detail in the manuscript, the Seebeck coefficient was calculated by Mott's approximation $$S = \frac{\pi^2 k_B^2 T}{3e} \frac{\partial \ln \sigma}{\partial \varepsilon_F},$$

where $\sigma$, $k_B$, e, and $\varepsilon_F$ are electrical conductivity, Boltzmann constant, Coulomb charge and Fermi energy, respectively. The electrical conductivity and Seebeck coefficient were gate-dependent for graphene, and electrical conductivity and Seebeck coefficient were measured experimentally for patterned graphene and unpatterned graphene. The heat capacity of graphene at room temperature was set to $c_p$=700 J/kg-K. To avoid the bolometric effect, the temperature-independent electrical conductivities were used for all the materials.

The bias voltage was applied across the gold terminals; one side was set to ground, and the other one at high potential. Except the gold terminals and graphene, everything else was electrically insulated. In addition, the current conservation boundary condition was applied for the whole geometry, and the initial values were set to V=0. In order to add contact resistance similar to the fabricated device, electrical contacts were introduced between gold. The heat flux was applied in the form of rectangular pulse with the period of 4 ms, which means for the first two milliseconds there was zero heat flux, corresponding to the dark state in the experiment, while for the next two milliseconds nonzero heat flux was applied on the patterned side of graphene using a laser heating. The Gaussian beam with spot size $R_{spot}$=2 mm and incident power $P_{inc}$=153 nW was used as the incident power, which set the heat flux $q_0$=(2$P_{incident}$/$\pi R^2_{spot}$)exp(2$R^2_{focus}$/$R^2_{spot}$) The absorbed heat flux depends on the light absorption at different Fermi levels. The light absorption as a function of gate voltage was calculated by Lumerical FDTD software, which ranged from A=34% at $E_F$=−0.55 eV to A=60% at $E_F$=−1.0 eV for patterned graphene. It means the absorbed heat flux was $q_{absorbed}$=A$q_0$.

The bottom side of the detector was kept at fixed temperature by using the boundary condition "temperature" in the software. The initial value of the temperature was set to $T_0$=293.15K, and the boundary condition "open boundary" was used across all the sides of the detector, except top and bottom surfaces, which means heat could flow inside or outside across the cross-sectional boundary depending on the ambient temperature. Thermal contacts were used between graphene, aluminum oxide, and silicon to control the heat transfer in the vertical direction. A user-controlled mesh, namely the free tetrahedral mesh, was used for gold, while the free triangular mesh was applied at the graphene surface, which were swept in vertical direction for the remaining geometry.

Figure 13:
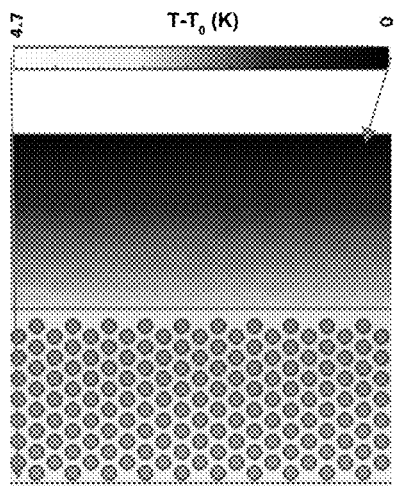
FIG. 13 show a simulated temperature profile of the half-patterned graphene detector at $E_F=-0.85$ eV, $\lambda_{res}=8.15$ µm and $V_{SD}=0.9$ V.
Figure 13:
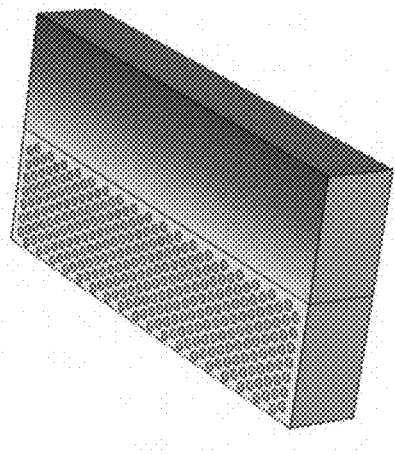
Figure 14:
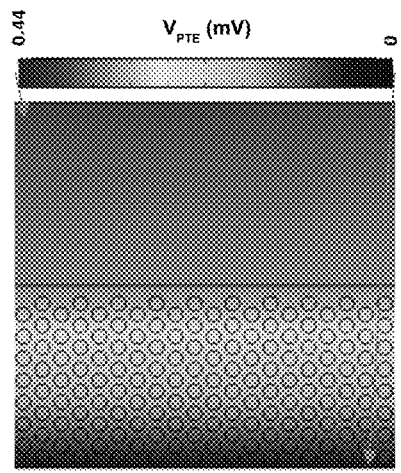
FIG. 14 illustrates the simulated potential profile of the half-patterned graphene detector at $E_F=-0.85$ eV, $\lambda_{res}=8.15$ µm and $V_{SD}=0.9$ V.
Figure 14:
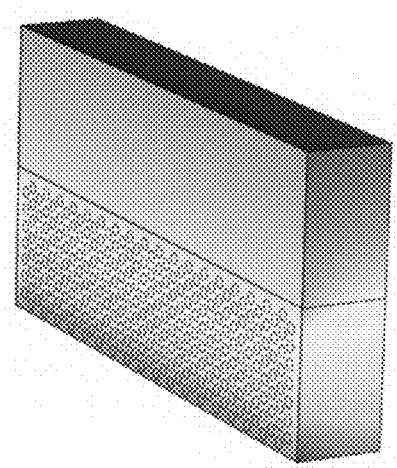

The time dependent solver with very low relative tolerance of $10^{-5}$ was used to measure the time dependent thermoelectric current by passing through the terminal for different Fermi levels. The dark and light thermoelectric voltages $V_{TE,D}$ and $V_{TE,L}$ were measured in the absence and presence of the incident heat flux, respectively. The photo-thermoelectric voltage $V_{PTE}$ current was then calculated by subtracting the dark from the light current, e.g., FIGS. 13 and 14 show the 3D and 2D cross-section profiles of the generated temperature and photovoltage.

$$V_{PTE} = V_{TE,L} - V_{TE,D}. \tag{7}$$

D.C. Photoresponse Measurement

For a fixed gate voltage, a D.C. bias voltage, $V_{SD}$, was applied across the source-drain, SD, terminals and the resulting current $I_1 = I + I_{TE}$ and $I_2 = I + I_{TE}$ was measured for applied voltage $\pm V_{SD}$, where I is the current generated by the bias voltage and $I_{TE}$ is the thermoelectric current, $I_{TE} = I_1 + I_2/2$. This thermoelectric current was measured in the dark, $I_{TE\text{-}D}$, and in the presence of mid-IR light, $I_{TE\text{-}L}$. Any contribution due the photoconductive effect is expected to be independent of the polarity of applied bias voltage, which was thereby eliminated in the $I_{TE\text{-}L}$ calculation. Therefore, the photothermoelectric current and voltage can be calculated as $I_{PTE} = I_{TE\text{-}L} - I_{TE\text{-}D}$ and $V_{PTE} = R_G I_{PTE}$, respectively. The D.C. responsivity, $\mathscr{R}_{D.C} = V_{PTE}/P_{inc}$, was calculated by using the measured incident light power, $P_{inc}$, the gate-tunable graphene resistance, $R_G$, and $I_{PTE}$. The circuit diagram is shown in FIG. 15.

Figure 17A:
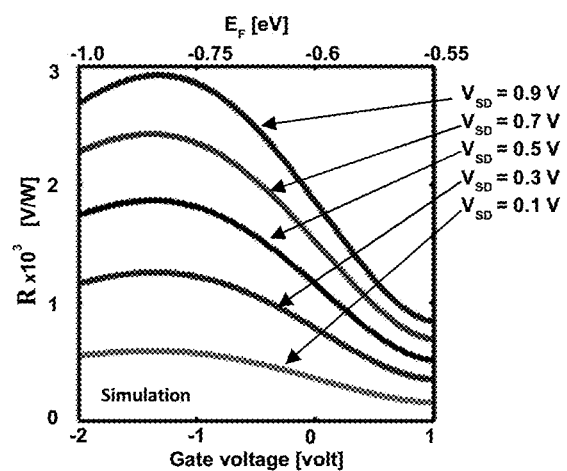
FIG. 17A illustrates the simulated D.C. responsivities of the half-patterned graphene sample as a function of gate-voltage for different bias voltages at $P_{inc}=153$ nW and $T_S=295$ K.
Figure 17B:
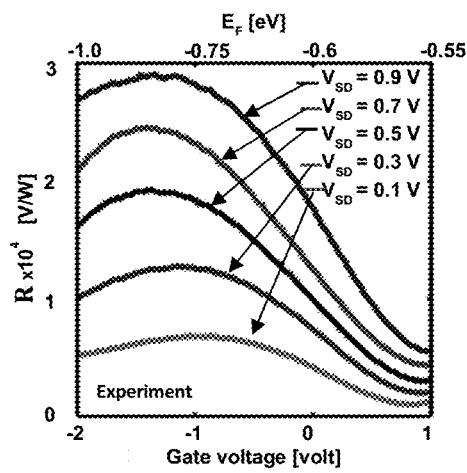
FIG. 17B demonstrates the measured D.C. responsivities of the half-patterned graphene sample as a function of gate-voltage for different bias voltages at $P_{inc}=153$ nW and $T_S=295$ K.

As mentioned in the manuscript, applying a D.C. bias as the source-drain voltage helps to increase the drift velocity of the hot carriers. In addition, asymmetric joule heating from the local photo-induced current helps to enhance the thermoelectric signal. It means the larger the bias, the larger responsivity is, and as long as the bias voltage does not lead to a dielectric breakdown, increase in the bias can assist in detection. FIG. 17A shows the simulated D.C. responsivity for different bias voltages, which is in very good agreement with the experimental results in FIG. 17B.

Figure 18A:
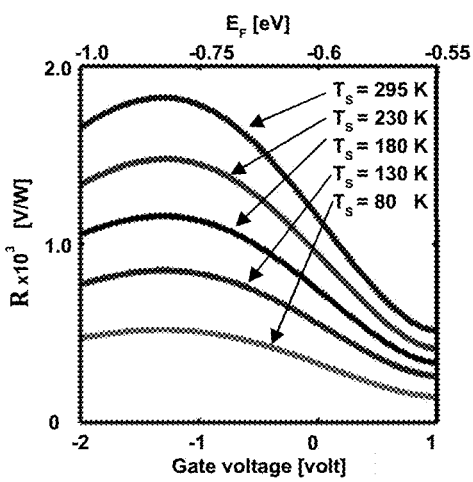
FIG. 18A illustrates the simulated D.C. responsivities of the half-patterned graphene sample as a function of gate-voltage for different substrate temperatures at $P_{inc}=153$ nW and $V_{SD}=0.5$ V.
Figure 18B:
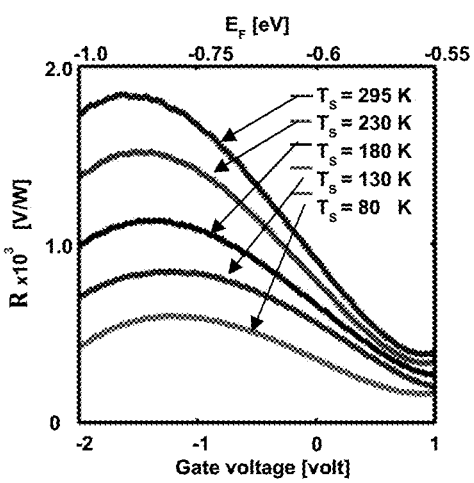
FIG. 18B shows the measured D.C. responsivities of the half-patterned graphene sample as a function of gate-voltage for different substrate temperatures at $P_{inc}=153$ nW and $V_{SD}=0.5$ V.
Figure 19:
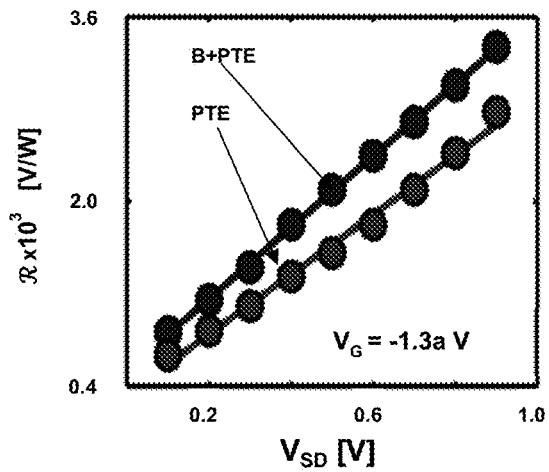
FIG. 19 illustrates D.C. responsivity as a function of bias voltage for gate voltage, $V_G=-1.3$ V.

According to FIGS. 8A-C, decrease in the graphene temperature lowers the Seebeck coefficient. One way to prove that the output signal is due to photothermoelectric effect is to study the behavior of the generated voltage at different substrate temperatures. The simulated results, see FIG. 18A, have very good agreement with the measured responsivities, see FIG. 18B, which show that as the temperature is decreased, the responsivity is reduced, which provides additional evidence that the Seebeck effect is indeed the dominant phenomenon in the present detection scheme. According to FIG. 19, the responsivity scales linearly with the applied bias voltage for both thermoelectric and combined thermoelectric-bolometric signals.

A.C. Photoresponse Measurement

The circuit diagram for A.C. photoresponse is shown in FIG. 20A. In the measurement setup, the sample was placed in front of a broadband blackbody source with a 8-12 μm filter in between. The Fermi level of graphene was fixed by applying a constant gate voltage. First, a sinusoidal bias voltage with a positive offset of 0.25 V was applied in the dark to the source-drain terminals. Due to this, an A.C. voltage was developed across resistor $R_2$ that was at the same frequency as the input bias voltage $[V_{SD+}^{dark}=0.25+\sin 2\pi f]$. The voltage across $R_2$ was recorded using a lock-in-amplifier. Next, in the presence of light, the voltage across $R_2$ $[V_{SD+}^{light}]$ was measured. The A.C. photovoltage was calculated by taking the difference $[V_{SD+}^{PV}=V_{SD+}^{light}-V_{SD+}^{dark}]$. The term $V_{SD+}^{PV}$ includes photoresponse from both photo-thermoelectric and photoconductive effects. Therefore, similar to the D.C. responsivity measurement protocol, in order to eliminate the photoconductive effect, the A.C. photovoltage, was measured for a negative offset bias voltage, and the difference $V_{SD+}^{PV}-V_{SD-}^{PV}$ yields the A.C. photo-thermoelectric voltage.

Figure 20B:
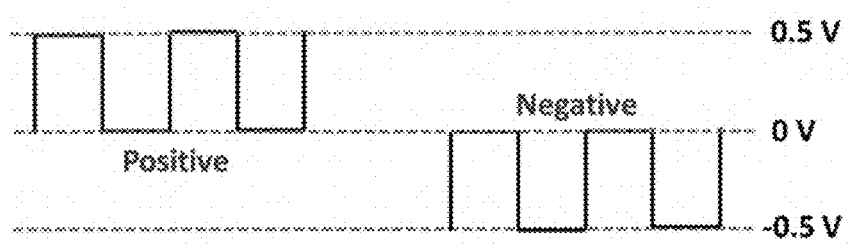
FIG. 20B illustrates the positive and negative input biases.

FIG. 20A illustrates the circuit used to measure A.C. response. The circuit includes a function generator (FG) 2010, a resister ($R_1$) 2020, a detector 2030, a Lock-in-amplifier (LIA) 2050, an amplifier resister ($R_2$) 2060 and a Gate voltage ($V_G$) 2040. FIG. 20B illustrates the positive and negative input biases.

Single-Pixel Imaging

Figure 21:
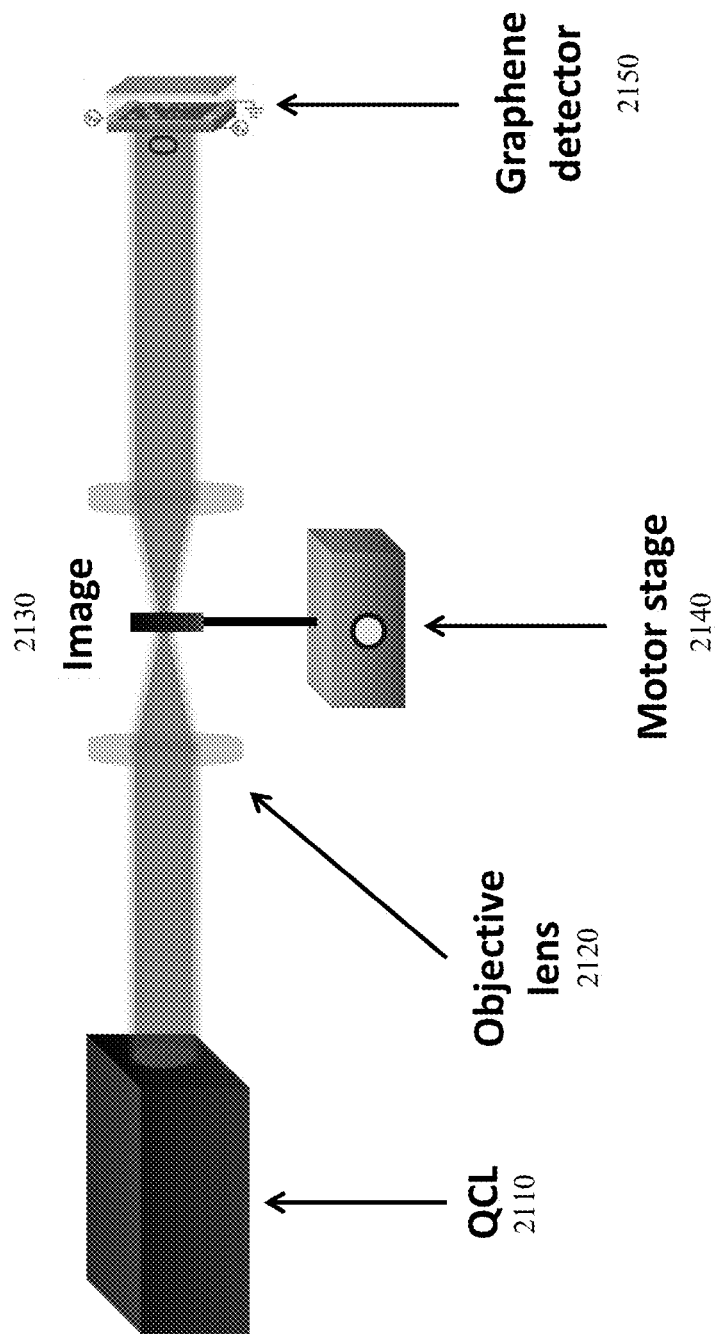
FIG. 21 shows a schematic of the single-pixel imaging setup.

To demonstrate the real performance of the photodetector, a single-pixel imaging method was used to image a Pegasus and UCF logo printed on a substrate. A quantum cascade laser (QCL) 2110, an automatic motor stage 2140 connected to the object 2130, a stencil and two objective lenses 2120 were used for the imaging by the single-pixel graphene detector 2150, as shown in FIG. 21.

As described above, various embodiments provide a method, apparatus and computer program(s) for ultrasensitive infrared photodetection, infrared imaging, and other optoelectronic applications using the plasmon assisted thermoelectric effect in graphene.

Figure 22:
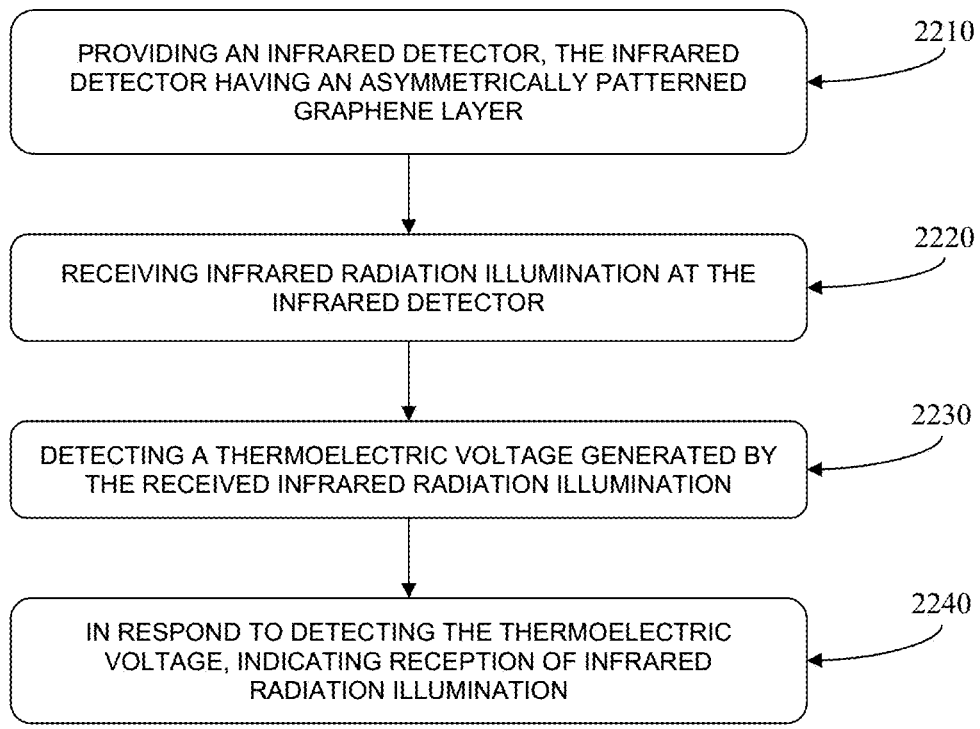
FIG. 22 is a logic flow diagram that illustrates the operation of a method, and a result of execution of computer program instructions embodied on a computer readable memory, in accordance with various embodiments.

FIG. 22 is a logic flow diagram that illustrates a method, and a result of execution of computer program instructions, in accordance with various embodiments. In accordance with an embodiment a method includes performing, at Block 2210, a step of providing an infrared detector, the infrared detector having an asymmetrically patterned graphene layer. At Block 2220, infrared radiation illumination is received at the infrared detector. A thermoelectric voltage generated by the received infrared radiation illumination is detected at Block 2230. In response to detecting the thermoelectric voltage, the method also includes performing, at Block 2240, a step of indicating reception of infrared radiation illumination.

The various blocks shown in FIG. 22 may be viewed as method steps, as operations that result from use of computer program code and/or as one or more logic circuit elements constructed to carry out the associated function(s).

Various operations described are purely exemplary and imply no particular order. Further, the operations can be used in any sequence when appropriate and can be partially used. With the above embodiments in mind, it should be understood that additional embodiments can employ various computer-implemented operations involving data transferred or stored in computer systems. These operations are those requiring physical manipulation of physical quantities. Usually, though not necessarily, these quantities take the form of electrical, magnetic, or optical signals capable of being stored, transferred, combined, compared, and otherwise manipulated.

Any of the operations described that form part of the presently disclosed embodiments may be useful machine operations. Various embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines employing one or more processors coupled to one or more computer readable medium, described below, can be used with computer programs written in accordance with the teachings herein, or it may be more convenient to construct a more specialized apparatus to perform the required operations.

The procedures, processes, and/or modules described herein may be implemented in hardware, software, embodied as a computer-readable medium having program instructions, firmware or a combination thereof. For example, the functions described herein may be performed by a processor executing program instructions out of a memory or other storage device.

The foregoing description has been directed to particular embodiments. However, other variations and modifications may be made to the described embodiments, with the attainment of some or all of their advantages. Modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

What is claimed is:

1. A method, comprising:
   providing an infrared detector, the infrared detector having an asymmetrically patterned graphene layer, wherein the infrared detector comprises a dielectric slab sandwiched between the asymmetrically patterned graphene layer and a back reflector;
   receiving infrared radiation illumination at the infrared detector;
   detecting a thermoelectric voltage generated by the received infrared radiation illumination; and
   in response to detecting the thermoelectric voltage, indicating reception of infrared radiation illumination.

2. The method of claim 1, wherein the infrared detector is an uncooled infrared detector.

3. The method of claim 1, wherein infrared radiation illumination is within the 3 µm-5 µm band.

4. The method of claim 1, wherein infrared radiation illumination is within the 8 µm-12 µm band.

5. The method of claim 1, wherein the asymmetrically patterned graphene layer is nanopatterned.

6. The method of claim 1, wherein the asymmetrically patterned graphene layer comprises a first patterned graphene section and a second graphene section, the second graphene section having no pattern.

7. The method of claim 6, wherein the first graphene section and the second, patterned graphene section extend in parallel along the length of a graphene channel.

8. The method of claim 1, wherein the asymmetrically patterned graphene layer comprises a pattern of holes in a hexagonal array.

9. A device, comprising:
   an infrared detector with an asymmetrically patterned graphene layer configured to generate a thermoelectric voltage in response to a received infrared radiation illumination, the infrared detector having a source, drain and gate;
   a function generator connected to the source;
   a lock-in amplifier connected to the drain; and
   a gate voltage connected to the gate.

10. The device of claim 9, wherein a first connection of the lock-in amplifier is connected to the source and a second, opposite connection of the lock-in amplifier is connected to ground.

11. The device of claim 10, wherein an amplifier resistor is connected in parallel with the lock-in amplifier.

12. The device of claim 9, wherein the function generator is connected to the source via a resistor.

13. The device of claim 9, wherein the asymmetrically patterned graphene layer comprises a first patterned graphene section and a second graphene section, the second graphene section having no pattern.

14. The device of claim 13, wherein the pattern comprises a hexagonal array of holes.

15. The device of claim 9, wherein the infrared detector comprises a graphene channel, and wherein the graphene channel comprises the asymmetrically patterned graphene layer.

16. The device of claim 15, wherein the asymmetrically patterned graphene layer comprises a first patterned graphene section and a second, unpatterned graphene section, the first patterned graphene section and the second, unpatterned graphene section extending in parallel along the length of the graphene channel.

17. The device of claim 9, wherein the asymmetrically patterned graphene layer is coupled to an optical cavity.

18. The device of claim 9, wherein the asymmetrically patterned graphene layer is a monolayer graphene layer.

19. The device of claim 9, wherein the infrared detector is an uncooled infrared detector.

* * * * *